(12) United States Patent
Lee

(10) Patent No.: US 10,388,358 B2
(45) Date of Patent: Aug. 20, 2019

(54) SEMICONDUCTOR MEMORY DEVICE AND OPERATING METHOD THEREOF

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/150,091

(22) Filed: Oct. 2, 2018

(65) Prior Publication Data

US 2019/0035451 A1 Jan. 31, 2019

Related U.S. Application Data

(63) Continuation of application No. 15/633,417, filed on Jun. 26, 2017, now Pat. No. 10,121,529.

(30) Foreign Application Priority Data

Sep. 22, 2016 (KR) .......................... 10-2016-0121655

(51) Int. Cl.
*G11C 5/14* (2006.01)
*G11C 11/4074* (2006.01)
(Continued)

(52) U.S. Cl.
CPC ........ *G11C 11/4074* (2013.01); *G11C 7/1051* (2013.01); *G11C 16/0483* (2013.01);
(Continued)

(58) Field of Classification Search
CPC .............. G11C 11/4074; G11C 7/1051; G11C 16/0483; G11C 16/08; G11C 16/10
(Continued)

(56) References Cited

U.S. PATENT DOCUMENTS 7,206,224 B1 * 4/2007 Randolph .......... G11C 16/0475
365/185.03
2010/0142285 A1 6/2010 Aritome et al.
(Continued)

FOREIGN PATENT DOCUMENTS

KR 1020130027686 A 3/2013
KR 1020150007397 A 1/2015
(Continued)

*Primary Examiner* — Vu A Le
(74) *Attorney, Agent, or Firm* — William Park & Associates Ltd.

(57) ABSTRACT

The semiconductor memory device includes a memory cell array, a peripheral circuit and a control logic. The memory cell array includes a plurality of memory cells. The peripheral circuit performs a program operation for the plurality of memory cells in the memory cell array. The control logic controls the peripheral circuit and the memory cell array such that, during the program operation for the plurality of memory cells, pre-bias voltages are applied to a plurality of word lines coupled to the plurality of memory cells to precharge channel regions of the plurality of memory cells. Furthermore, different pre-bias voltages are applied to the plurality of word lines depending on the relative positions of the word lines.

24 Claims, 12 Drawing Sheets

(51) Int. Cl.
*H01L 27/105* (2006.01)
*H01L 27/06* (2006.01)
*H01L 29/76* (2006.01)
*G11C 16/08* (2006.01)
*G11C 16/30* (2006.01)
*G11C 7/10* (2006.01)
*G11C 29/34* (2006.01)
*G11C 16/04* (2006.01)
*G11C 16/10* (2006.01)

(52) U.S. Cl.
CPC .............. *G11C 16/08* (2013.01); *G11C 16/10* (2013.01); *G11C 16/30* (2013.01); *G11C 29/34* (2013.01); *H01L 27/0688* (2013.01); *H01L 27/105* (2013.01); *H01L 29/76* (2013.01)

(58) Field of Classification Search
USPC ..................................................... 365/189.09
See application file for complete search history.

(56) References Cited

U.S. PATENT DOCUMENTS

2010/0321998 A1* 12/2010 Jang .................... G11C 11/5628
365/185.03
2013/0064029 A1   3/2013  Park et al.
2015/0221380 A1*  8/2015  Lee ........................ G11C 16/10
365/185.11

FOREIGN PATENT DOCUMENTS

KR    1020170111653 A    10/2017
KR    1020170121618 A    11/2017

* cited by examiner

SEMICONDUCTOR MEMORY DEVICE AND OPERATING METHOD THEREOF

CROSS-REFERENCE TO RELATED APPLICATION

The present application is a continuation application for U.S. patent application Ser. No. 15/633,417 and claims priority under 35 U.S.C § 119(a) to Korean patent application 10-2016-0121655, filed on Sep. 22, 2016 in the Korean Intellectual Property Office, the entire disclosure of which is incorporated herein by reference in its entirety as though fully set forth herein.

BACKGROUND

The present invention relates generally to an electronic device, and more particularly, to a semiconductor memory device and an operating method thereof.

Semiconductor devices, in particular semiconductor memory devices, are classified into volatile memory devices and nonvolatile memory devices.

The nonvolatile memory devices can maintain data stored therein even when supply of power is interrupted, although read and write speeds are comparatively low. Therefore, the nonvolatile memory device is used when there is the need for storing data which must be maintained regardless of supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

Flash memory devices may be classified into a two-dimensional semiconductor device, in which strings are horizontally formed on a semiconductor substrate, and a three-dimensional semiconductor device in which strings are vertically formed on a semiconductor substrate. Three-dimensional semiconductor memory devices are memory devices that overcome the limitation in the degree of integration of two-dimensional semiconductor memory devices, and include a plurality of strings that are vertically formed on a semiconductor substrate. Each string includes a drain select transistor, a plurality of memory cells, and a source select transistor that are coupled in series between a bit line and a common source line (SL).

SUMMARY

Various embodiments in accordance with the present invention are directed toward a semiconductor memory device configured to mitigate a program disturb phenomenon, and a method of operating the semiconductor memory device.

In an embodiment in accordance with the present invention, a semiconductor memory device includes a memory cell array, a peripheral circuit and a control logic. The memory cell array includes a plurality of memory cells. The peripheral circuit performs a program operation for the plurality of memory cells in the memory cell array. The control logic controls the peripheral circuit and the memory cell array such that, during the program operation for the plurality of memory cells, pre-bias voltages are applied to a plurality of word lines coupled to the plurality of memory cells to precharge channel regions of the plurality of memory cells. Furthermore, different pre-bias voltages are applied to the plurality of word lines depending on the respective positions of the word lines.

In an embodiment, the word lines may be grouped into a plurality of word line groups. Furthermore, the closer a word line group to which a word line belongs is to a first-programmed memory cell in the memory cell array, the lower a pre-bias voltage to be applied to the word line may be.

In an embodiment, the word lines may be grouped into a plurality of word line groups. In this case, the memory cells may be programmed in a sequence from a memory cell adjacent to a source select transistor. Furthermore, the closer a word line group to which a word line belongs is to a drain select transistor in the memory cell array, the higher a pre-bias voltage to be applied to the word line may be.

In an embodiment, each of the word line groups may include the same number of word lines.

In accordance with one aspect, the closer a word line group is to a source select transistor in the memory cell array, the more the number of word lines included in the word line group may be.

Pre-bias voltages that are applied to word lines of a word line group to which a word line coupled to a program cell belongs may have a default value, and pre-bias voltages that are applied to word lines disposed between the word line group to which the word line coupled to the program cell belongs, and the source select transistor, may also have the default value.

The control logic may determine a precharge voltage to be applied to a common source line based on a position of a program cell.

In an embodiment in accordance with the present invention, the control logic may control the peripheral circuit and the memory cell array such that the closer the program cell is to the source select transistor, the higher a precharge voltage to be applied to the common source line is.

The word lines may be grouped into a plurality of word line groups, and the memory cells may be programmed in a sequence from a memory cell adjacent to a drain select transistor. In this case, the closer a word line group to which a word line belongs is to a source select transistor in the memory cell array, the higher a pre-bias voltage to be applied to the word line may be.

Pre-bias voltages that are applied to word lines of a word line group to which a word line coupled to a program cell belongs may have a default value, and pre-bias voltages that are applied to word lines disposed between the word line group to which the word line coupled to the program cell belongs, and the drain select transistor, may also have the default value.

In an embodiment, the control logic may determine a precharge voltage to be applied to a common source line based on a position of a program cell, and control the peripheral circuit and the memory cell array such that the closer the program cell is to the drain select transistor, the higher a precharge voltage to be applied to the common source line is.

The control logic may control the peripheral circuit and the memory cell array such that a program loop for a selected program cell is performed after the application of the pre-bias voltages.

In another embodiment in accordance with the present invention, an operating method of a semiconductor memory device includes grouping a plurality of word lines coupled to a plurality of memory cells in a memory cell array into a plurality of word line groups; applying, based on a result of the grouping of the word lines, different pre-bias voltages to the respective word line groups to which the word lines belong, depending on a position of a word line group to which a selected program word line belongs, and precharging channel regions of the memory cells; and performing a program operation for a selected program cell among the memory cells.

In an embodiment, the applying, based on the result of the grouping of the word lines, the different pre-bias voltages to the respective word line groups to which the word lines belong, depending on the position of the word line group to which a selected program word line belongs, and the precharging of the channel regions of the memory cells may include applying the pre-bias voltages to the respective word line groups such that the closer a word line group to which a word line belongs is to a first programmed memory cell in the memory cell array, the lower a pre-bias voltage to be applied to the word line is.

In accordance with one aspect, the memory cells are programmed in a sequence from a memory cell adjacent to a drain select transistor. Furthermore, the applying, based on the result of the grouping of the word lines, the different pre-bias voltages to the respective word line groups to which the word lines belong, depending on the position of the word line group to which the selected program word line belongs, and the precharging of the channel regions of the memory cells may include: applying the pre-bias voltages to the respective word line groups such that the closer a word line group to which a word line belongs is to a drain select transistor in the memory cell array, the higher a pre-bias voltage to be applied to the word line is.

The grouping of the word lines coupled to the memory cells in the memory cell array into the word line groups may include: grouping the word lines such that each of the word line groups includes the same number of word lines.

The grouping of the word lines coupled to the memory cells in the memory cell array into the word line groups may include: grouping the word lines such that the closer a word line group is to the source select transistor in the memory cell array, the more the number of word lines included in the word line group is.

In an embodiment, the applying, based on the result of the grouping of the word lines, the different pre-bias voltages to the respective word line groups to which the word lines belong, depending on the position of the word line group to which the selected program word line belongs, and the precharging of the channel regions of the memory cells may include: determining a precharge voltage to be applied to a common source line such that the closer the program cell is to a first-programmed memory cell in the memory cell array, the higher the precharge voltage is.

In an embodiment, the determining the precharge voltage to be applied to the common source line such that the closer the program cell is to the first-programmed memory cell in the memory cell array, the higher the precharge voltage is may include: determining a precharge voltage to be applied to the common source line such that the closer the program cell is to the source select transistor, the higher the precharge voltage is.

In one aspect, the memory cells may be programmed in a sequence from a memory cell adjacent to a drain select transistor. Furthermore, the applying, based on the result of the grouping of the word lines, the different pre-bias voltages to the respective word line groups to which the word lines belong, depending on the position of the word line group to which the selected program word line belongs, and the precharging of the channel regions of the memory cells may include: applying the pre-bias voltages to the respective word line groups such that the closer a word line group to which a word line belongs is to a source select transistor in the memory cell array, the higher a pre-bias voltage to be applied to the word line is.

In an embodiment, the applying, based on the result of the grouping of the word lines, the different pre-bias voltages to the respective word line groups to which the word lines belong, depending on the position of the word line group to which the selected program word line belongs, and the precharging of channel regions of the memory cells may include: determining a precharge voltage to be applied to a common source line such that the closer the program cell is to the drain select transistor, the higher the precharge voltage is.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
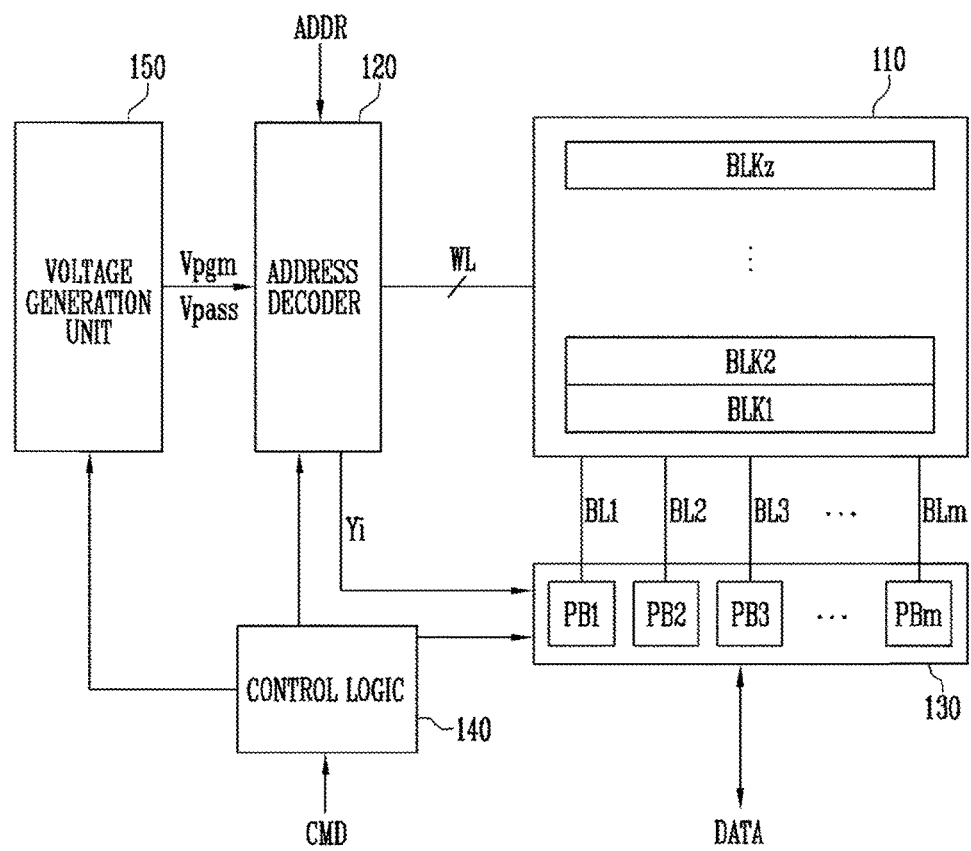
FIG. 1 is a block diagram illustrating a semiconductor memory device in an embodiment in accordance with the present invention.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 illustrates that a semiconductor memory device 100 includes a memory cell array 110, an address decoder 120, a read/write circuit 130, a control logic 140, and a voltage generation unit 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the plurality of memory cells may be nonvolatile memory cells. The plurality of memory cells coupled in common to a single word line are defined as one page. Furthermore, each memory block includes a plurality of pages. The plurality of memory cells included in the plurality of pages are successively stacked along a vertical plug on a semiconductor substrate.

A program operation of the semiconductor memory device 100 is performed on a page basis. Each of the memory blocks BLK1 to BLKz of the memory cell array 110 includes a plurality of cell strings. Each of the cell strings includes a plurality of memory cells stacked on the semiconductor substrate. Each of the cell strings includes a drain select transistor, a plurality of memory cells and a source select transistor, which are coupled between a bit line BL and a common source line SL.

The address decoder 120, the read/write circuit 130, and the voltage generation unit 150 are operated as peripheral circuits for driving the memory cell array 110.

The address decoder 120 is coupled to the memory cell array 110 through the word lines WL. The address decoder 120 is configured to operate in response to control of the control logic 140. The address decoder 120 receives addresses ADDR through an input/output buffer (not shown) provided in the semiconductor memory device 100. The address decoder 120 is configured to decode a row address among the received addresses ADDR. The address decoder 120 applies, during a program operation, program voltages Vpgm, pass voltages Vpass and operating voltages which are generated from the voltage generation unit 150, to a plurality of memory cells, and drain and source select transistors of the memory cell array 110 in accordance with a decoded row address among the received addresses ADDR. The address decoder 120 is configured to decode a column address Yi among the received addresses ADDR. The address decoder 120 transmits the decoded column address Yi to the read/write circuit 130.

Addresses ADDR received in a request for a program operation include a block address, a row address, and a column address Yi. The address decoder 120 selects one memory block and one word line in accordance with the block address and the row address. The column address Yi is decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The plurality of page buffers PB1 to PBm are coupled to the memory cell array 110 through the bit lines BL1 to BLm. Each of the page buffers PB1 to PBm receives program data DATA during a program operation and temporarily stores it, and controls, using a program enable voltage or a program inhibit voltage, the potential of a corresponding one of the bit lines BL1 to BLm in accordance with the program data DATA. Furthermore, each of the page buffers PB1 to PBm senses a program state of a corresponding memory cell during a program verify operation, compares it with the program data DATA temporarily stored during the program operation, and verifies whether the corresponding memory cell has been completely programmed.

The read/write circuit 130 may operate in response to control of the control logic 140. In an embodiment, the read/write circuit 130 may include page buffers (or page resistors), a column select circuit, etc.

The control logic 140 is coupled to the address decoder 120, the read/write circuit 130, and the voltage generation unit 150. The control logic 140 receives a command CMD through an input/output buffer (not shown) of the semiconductor memory device 100. The control logic 140 is configured to control the overall operation of the semiconductor memory device 100 in response to the command CMD.

The control logic 140, in an embodiment in accordance with the present invention, may apply pre-bias voltages to the word lines during a program operation. The control logic 140 may apply different pre-bias voltages to the word lines depending on the respective positions of the word lines.

During a program operation, the voltage generation unit 150 generates and outputs program voltages Vpgm, pass voltages Vpass, and a plurality of operating voltages under the control of the control logic 140. The plurality of operating voltages may include a pipe transistor operating voltage or the like. As described herein, all elements other than the memory cell array 110 and the control logic 140 may be commonly called peripheral circuits.

Figure 2:
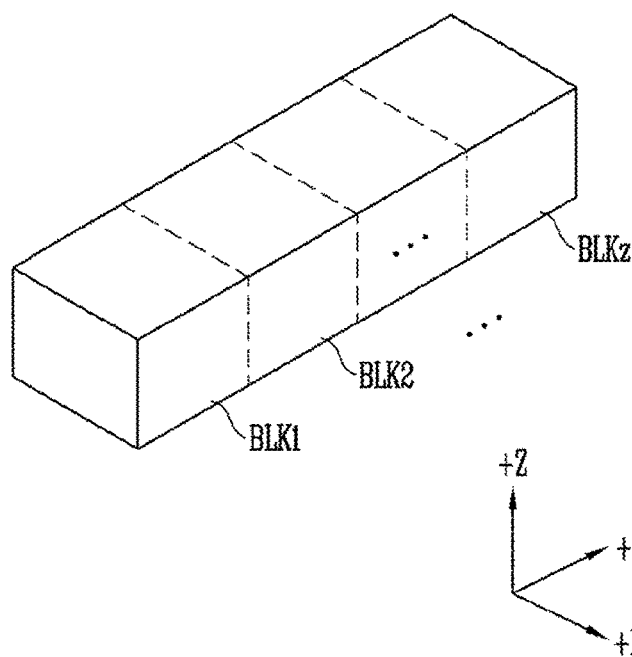
FIG. 2 is a block diagram for describing an embodiment of the memory cell array of FIG. 1.

FIG. 2 shows that the memory cell array 110 includes the plurality of memory blocks BLK1 to BLKz. Each memory block may have a three-dimensional structure. Each memory block includes a plurality of memory cells stacked along the vertical plug on the semiconductor substrate. The memory cells may be arranged in +X, +Y, and +Z directions.

Figure 3:
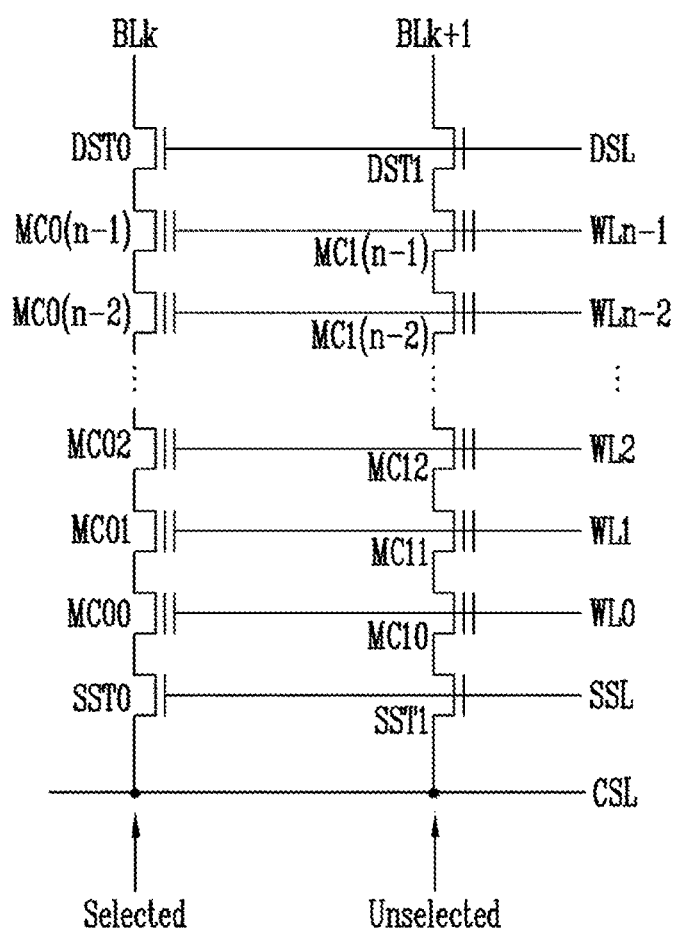
FIG. 3 is a circuit diagram illustrating portions of cell strings in the memory cell array.

Referring now to FIG. 3, only two cell strings are illustrated among the cell strings included in the plurality of memory blocks of the memory cell array. That is, there are illustrated a selected cell string that is targeted for a program operation, and an unselected cell string disposed at a position adjacent to the selected cell string, among unselected cell strings that are not targeted for the program operation. The selected cell string is coupled to a bit line BLk, and the unselected cell string is coupled to a bit line BLk+1.

FIG. 3 illustrates that the selected cell string is coupled between a common source line CSL and the corresponding bit line BLk, and includes a source select transistor SST0, memory cells MC00 to MC0(n−1), and a drain select transistor DST0. The source select transistor SST0 and the drain select transistor DST0 are respectively coupled to a source select line SSL and a drain select line DSL. The memory cells MC00 to MC0(n−1) are respectively coupled to the word lines WL0 to WLn−1. The memory cells MC00 to MC0(n−1) coupled to the different word lines WL0 to WLn−1 are included in different pages. The unselected cell string is coupled between the common source line CSL and the corresponding bit line BLk+1, and includes a source select transistor SST1, memory cells MC10 to MC1(n−1), and a drain select transistor DST1. The source select transistor SST1 and the drain select transistor DST1 are respectively coupled to the source select line SSL and the drain select line DSL. The memory cells MC10 to MC1(n−1) are respectively coupled to the word lines WL0 to WLn−1. The memory cells MC10 to MC1(n−1) coupled to the different word lines WL0 to WLn−1 are included in different pages.

The word lines coupled to a memory string in a memory block may be grouped, and different pre-bias voltages may be applied to the respective groups during a precharge operation of the cell string. Consequently, a uniform precharge level in the entirety of the cell string may be formed.

The operation of applying different pre-bias voltages to word lines at a precharging step during a program operation, in an embodiment in accordance with the present invention, will be described in detail subsequently with reference to FIGS. 4A to 8.

Figure 4A:
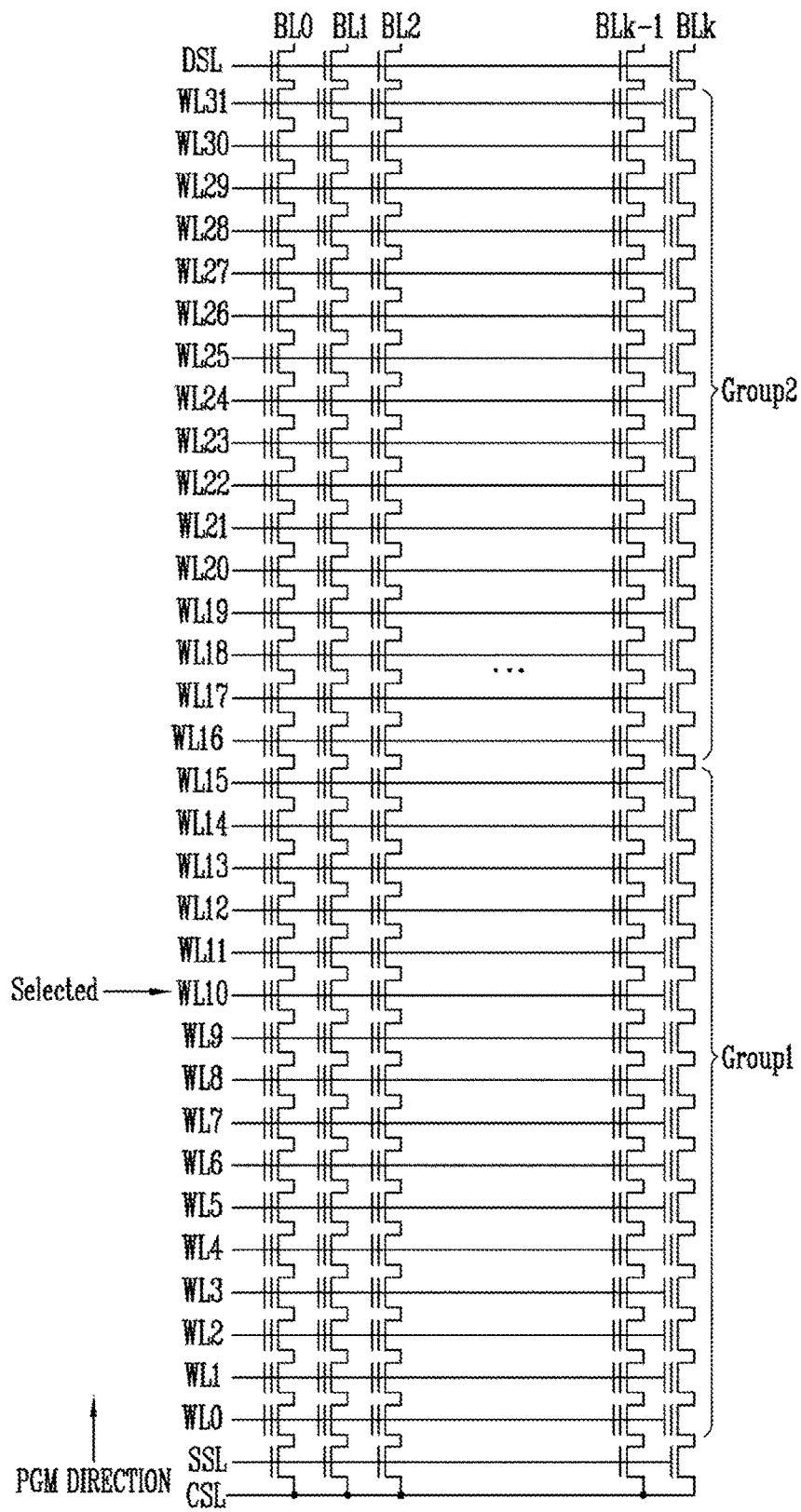
FIG. 4A is a diagram illustrating a method of grouping a plurality of word lines and applying pre-bias voltages thereto, in an embodiment in accordance with the present invention.

FIG. 4A illustrates a method of grouping a plurality of word lines and applying pre-bias voltages thereto.

Referring to FIG. 4A, a control logic of the semiconductor memory device, in an embodiment in accordance with the present invention, may group word lines in a memory block. The memory block includes thirty-two word lines WL0 to WL31. The control logic in FIG. 4A may group the thirty-two word lines into two word line groups. Each of a first word line group Group1 and a second word line group Group2 includes sixteen word lines.

The control logic may determine, based on the result of the grouping, pre-bias voltages to be applied to the respective word lines WL0 to WL31 depending on a position of a word line coupled to the target memory cell to be programmed. The pre-bias voltages are voltages to be applied to the respective word lines WL0 to WL31 in a precharging step during a program operation for the program cell.

FIG. 4A illustrates the case where a target program cell to be programmed is coupled to a tenth word line WL10 that is included in the first word line group Group1. This is the case where a memory cell proximate, or relatively close to the source select transistor is programmed. That is, in an embodiment of FIG. 4A, a program direction is a direction from a zeroth word line WL0 toward a thirty-first word line WL31. In the case of the typical program operation, during a precharge operation of an unselected memory string, a threshold voltage of a memory cell is increased by a resistance component between the source select transistor and the drain select transistor. Consequently, the precharge level in a source select side channel is reduced and thus channel boosting is not effectively generated. Therefore, a program disturb occurs. In the case of the semiconductor memory device according to the embodiment of the present disclosure, during a precharge process, the closer a word line group to which a word line belongs is to the drain select transistor, the higher a pre-bias voltage to be applied to the word line may be. In other words, in the semiconductor memory device in an embodiment in accordance with the present invention, during a precharge process, in the case of a word line group including the word line WL0 coupled to the first-programmed memory cell or a word line group that is close thereto, a relatively low pre-bias voltage may be applied to the corresponding word line group. In the case of a word line group including the word line WL31 coupled to the memory cell to be last programmed or a word line group that is close thereto, a comparatively high pre-bias voltage may be applied to the corresponding word line. Therefore, effects caused by the resistance component between the source select transistor and the drain select transistor are offset, whereby the precharge level in the channel may be uniformly formed. Consequently, a program disturb phenomenon is mitigated.

Referring again to FIG. 4, in the case where the word line coupled to the program cell is included in the first group Group1, during a precharge operation, a pre-bias voltage having a default value may be applied to the word lines WL0 to WL15 included in the first group Group1, and a pre-bias voltage higher by a predetermined value than the default value may be applied to the word lines WL16 to WL 31 included in the second group Group2. That is, the pre-bias voltage that is applied to the word lines included in the second group Group2 is higher than the pre-bias voltage that is applied to the word lines included in the first group Group1.

A precharge voltage to be applied to the common source line during a precharge operation may be set to be changed depending on the position of the selected word line. For example, the closer a target program cell to be programmed is to the source select transistor, the higher the precharge voltage to be applied to the common source line may be. For example, the closer a target program cell to be programmed is to the drain select transistor, the lower the precharge voltage to be applied to the common source line may be.

After the pre-bias voltage is applied to the respective word lines and the precharge operation is completed, a program voltage may be applied to the selected word line WL10, and a pass voltage may be applied to unselected word lines WL0 to WL9 and WL11 to WL31. The above-mentioned operation is a program loop for memory cells, and the program loop may be repeatedly performed.

In a case where the program cell is coupled to a word line included in the second word line group Group2, the same default value may be applied as a pre-bias voltage to the entire word lines WL0 to WL31. For example, in the case where the program cell is coupled to a twenty-ninth word line WL28, memory cells coupled to the first to twenty-eighth word lines WL0 to WL27 are in a program-completed state. In this case, there is little need for applying a higher pre-bias voltage to word lines that are relatively close to the drain select transistor. Therefore, in this case, a pre-bias voltage having the same value may be applied to the entire word lines WL0 to WL31 included in the first group and the second group, Group1 and Group2.

FIG. 4A illustrates an embodiment in which the word lines are grouped into the two word line groups. However, word lines of the semiconductor memory device may be grouped into three or more word line groups.

Figure 4B:
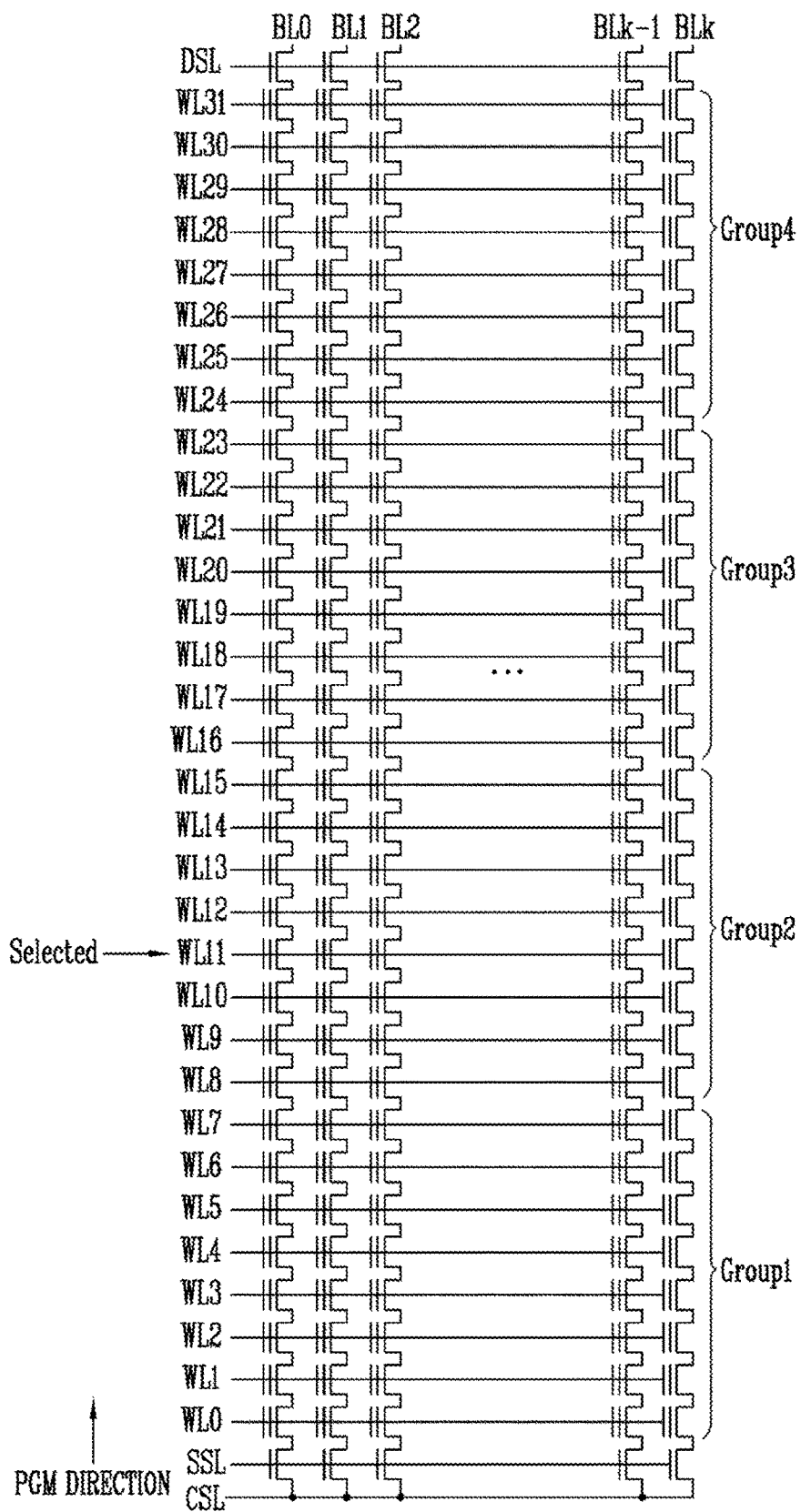
FIG. 4B is a diagram illustrating a method of grouping a plurality of word lines and applying pre-bias voltages thereto, in another embodiment in accordance with the present invention.

FIG. 4B is a diagram illustrating a method of grouping a plurality of word lines and applying pre-bias voltages thereto, in another embodiment in accordance with the present invention.

Referring to FIG. 4B, the control logic may group the thirty-two word lines into four word line groups. Each of first to fourth word line groups Group1 to Group4 includes eight word lines. Here, there will be described the case where eleventh word line WL11 is selected.

As described with reference to FIG. 4A, based on a group in which a selected word line is included, the closer a group is to the drain select transistor, the higher a pre-bias voltage to be applied to corresponding word lines is. That is, a pre-bias voltage that is applied to word lines WL16 to WL23 included in a third group Group3 may be higher than a pre-bias voltage that is applied to word lines WL8 to WL15 included in a second group Group2. Furthermore, a pre-bias voltage that is applied to word lines WL24 to WL31 included in a fourth group Group4 may be higher than a pre-bias voltage that is applied to word lines WL16 to WL23 included in the third group Group3. A pre-bias voltage having a default value is applied to the word lines WL8 to WL15 included in the second group Group2, including a word line WL11 that is coupled to a selected transistor. In addition, the pre-bias voltage having the default value also is applied to word lines WL0 to WL7 included in a first group, Group1, that is closer to the source select transistor than is the second group.

In another embodiment, in the case where the selected transistor is coupled to a word line included in the third group Group3, a pre-bias voltage having the default value may be applied to the word lines WL0 to WL23 included in the first to third groups Group1 to Group3, and a pre-bias voltage having a value higher than the default value may be applied to the word lines WL24 to WL31 included in the fourth group, Group4.

Figure 4C:
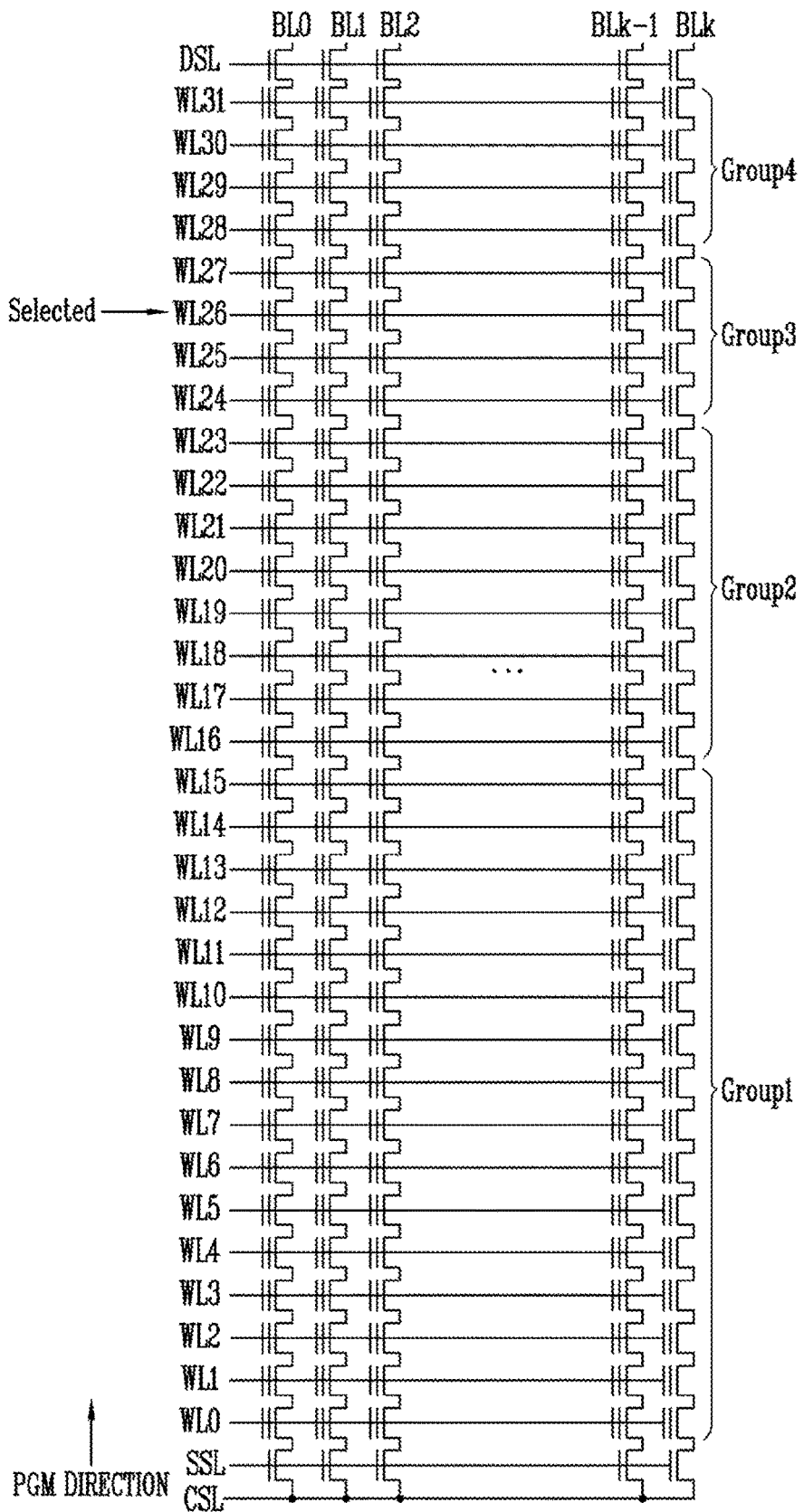
FIG. 4C is a diagram illustrating a method of grouping a plurality of word lines and applying pre-bias voltages thereto, in yet another embodiment in accordance with the present invention.

FIG. 4C is a diagram illustrating a method of grouping a plurality of word lines and applying pre-bias voltages thereto, according to yet another embodiment.

Although FIGS. 4A to 4B illustrate the embodiments in which each of the word line groups include the same number of word lines, in the semiconductor memory device and operating method thereof in accordance with the present invention, each of the word line groups may include different numbers of word lines. For example, as shown in FIG. 4C, the closer a word line group is to the drain select transistor, the fewer the number of word lines included therein may be.

Figure 5A:
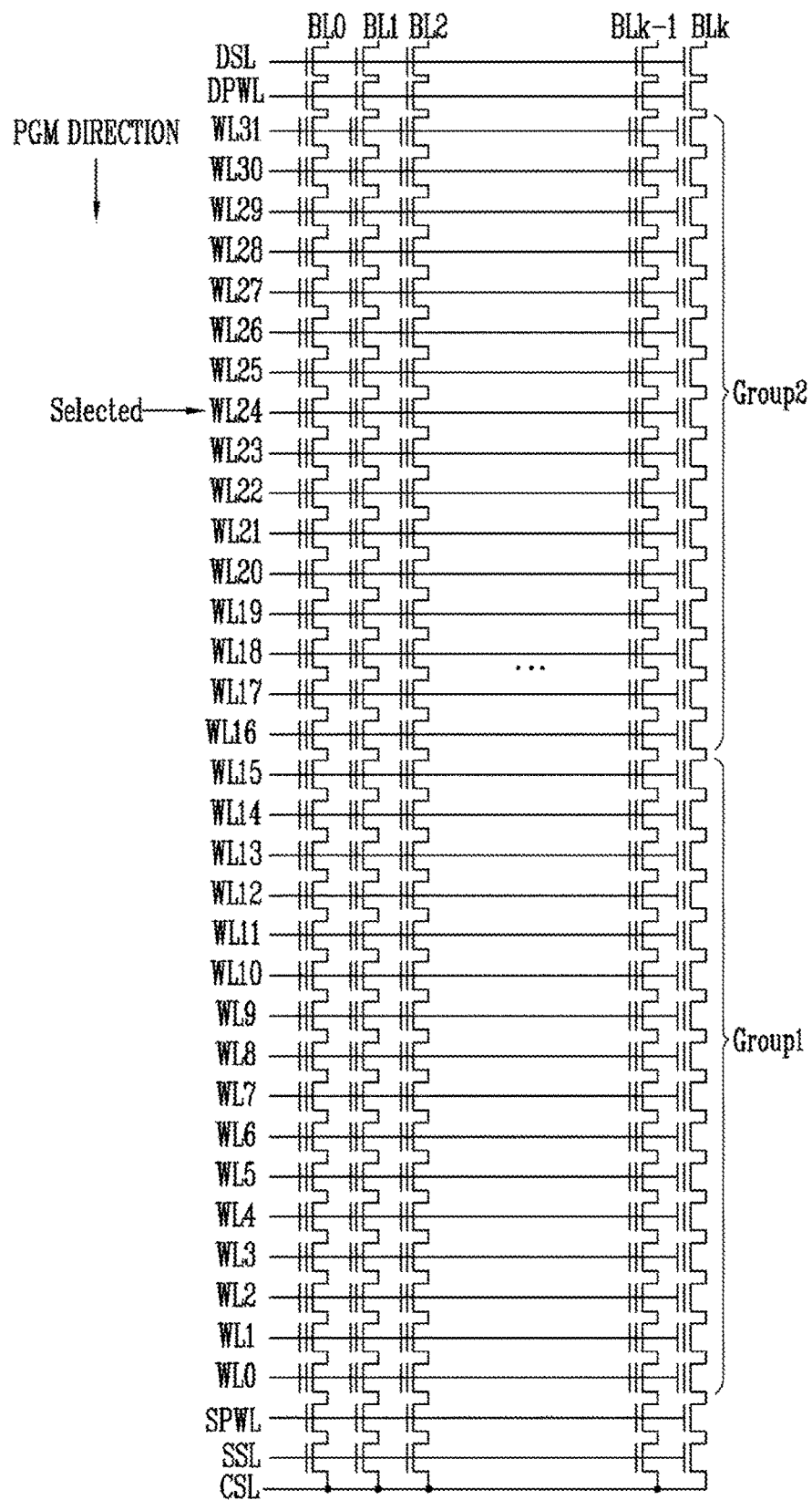
FIG. 5A is a diagram illustrating a method of grouping a plurality of word lines and applying pre-bias voltages thereto, in still another embodiment in accordance with the present invention.

FIG. 5A is a diagram illustrating a method of grouping a plurality of word lines and applying pre-bias voltages thereto, according to still another embodiment.

Referring to FIG. 5A, unlike the scenarios depicted in FIGS. 4A to 4C, there is illustrated an embodiment in which memory cells that are close to the drain select line DSL are first programmed. That is, in an embodiment of FIG. 5A, a program direction is a direction from a thirty-first word line WL31 toward a zeroth word line WL0. For this, an additional drain side power word line DPWL may be included between the drain select line DSL and the word lines, and related transistors may also be provided. Furthermore, an additional source side power word line SPWL may be included between the source select line SSL and the word lines, and related transistors may also be provided.

According to the embodiment of FIG. 5A, in the case where, for example, a selected word line WL24 is included in a second group Group2, a pre-bias voltage having a default value is applied to word lines WL16 to WL31 included in the second group Group2, and a pre-bias voltage having a value higher than the default value is applied to word lines WL0 to WL15 included in a first group Group1. That is, in the semiconductor memory device in an embodiment in accordance with the present invention, in the case where a program operation is first performed on a memory cell adjacent to the drain select transistor, the closer a word line group to which a word line belongs is to the source select transistor, the higher the pre-bias voltage to be applied to the word line may be. In other words, during a precharge process, in the case of a word line group including the word line WL31 coupled to the first-programmed memory cell or a word line group that is close thereto, a relatively low pre-bias voltage may be applied to the corresponding word line group. In the case of a word line group including the word line WL0 coupled to the memory cell to be last programmed or a word line group that is close thereto, a relatively high pre-bias voltage may be applied to the corresponding word line group.

Figure 5B:
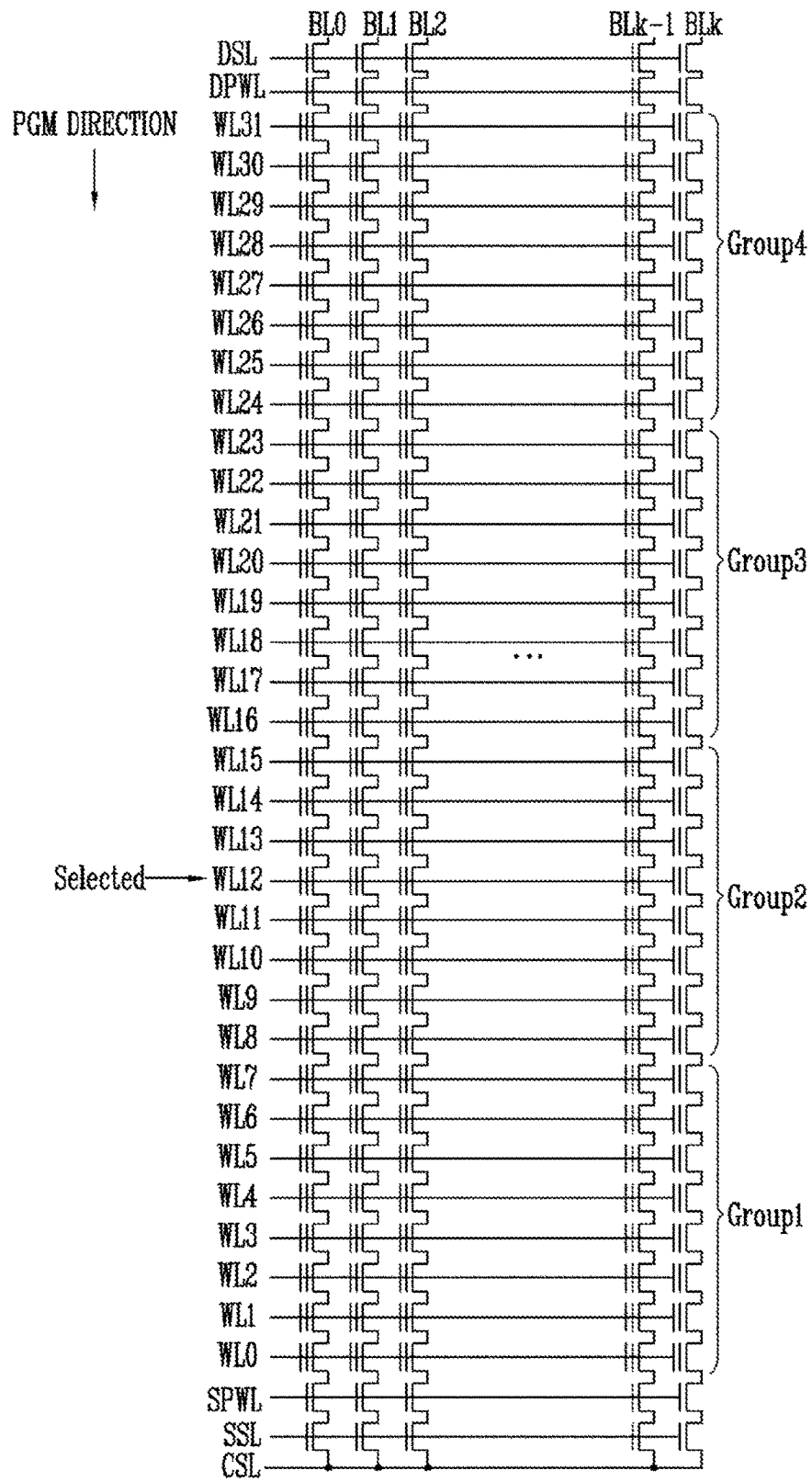
FIG. 5B is a diagram illustrating a method of grouping a plurality of word lines and applying pre-bias voltages thereto, in still another embodiment in accordance with the present invention.

FIG. 5B is a diagram illustrating a method of grouping a plurality of word lines and applying pre-bias voltages thereto, according to still another embodiment.

In FIG. 5B, a twelfth word line WL12 is selected. Therefore, a pre-bias voltage having a default value is applied to word lines WL8 to WL31 included in second to fourth groups Group2 to Group4, and a pre-bias voltage having a value higher than the default value is applied to word lines WL0 to WL7 included in a first group Group1.

Figure 6:
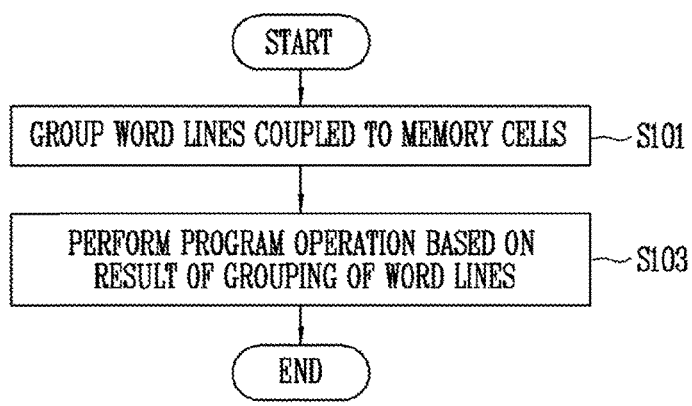
FIG. 6 is a flowchart showing a method of programming the semiconductor memory device in an embodiment in accordance with the present invention.

FIG. 6 is a flowchart showing a method of programming the semiconductor memory device according to an embodiment.

Referring to FIG. 6, the method of programming the semiconductor memory device according to an embodiment includes a step S101 of grouping word lines coupled to memory cells into a plurality of word line groups, and a step S103 of performing a program operation based on a result of the grouping of the word lines. At step S101, the number of groups of word lines to be grouped and the number of word lines to be included in each of the word line groups may be determined. At step S103, based on the determined result of the grouping of the word lines, pre-bias voltages to be applied to word lines included in the respective groups may be determined depending on which word line group is the group to which the selected word line belongs, and then a program operation may be performed.

Figure 7:
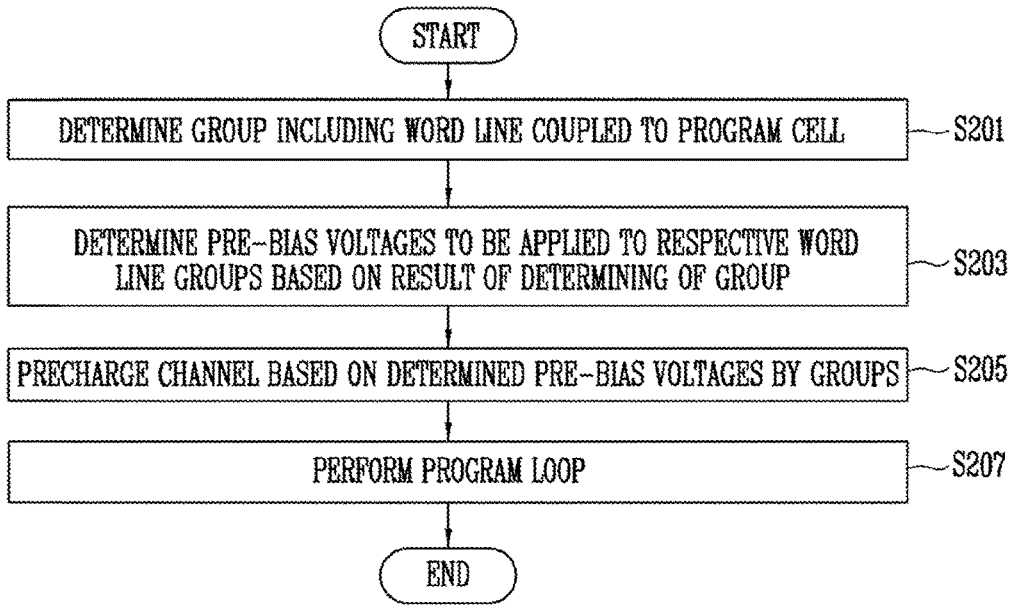
FIG. 7 is a flowchart illustrating the step of performing a program operation, based on a result of grouping the word lines of FIG. 6.

FIG. 7 is a flowchart illustrating the step of performing the program operation, based on the result of grouping the word lines in FIG. 6.

Referring to FIG. 7, the step of performing the program operation based on the result of the grouping of the word lines includes a step S201 of determining a word line group that includes a word line coupled to a program cell, a step S203 of determining pre-bias voltages to be applied to the respective word line groups based on a result of the determining of the word line group, a step S205 of precharging channel regions of memory cells based on the determined pre-bias voltages, and a step S207 of performing a program loop. At the step S201 of determining the word line group that includes the word line coupled to the program cell, which one of the word line groups is the word line group to which the word line coupled to the program cell belongs, is determined. At the step S203 of determining pre-bias voltages to be applied to the respective word line groups based on the result of determining of the word line group, the pre-bias voltages to be applied to word lines included in the respective word line groups are determined. As described above with reference to FIGS. 4A to 4C, the closer a word line group is to the drain select transistor, the higher pre-bias voltages to be applied to corresponding word lines may be. At the step S205 of precharging channel regions of memory cells based on the determined pre-bias voltages, the determined pre-bias voltages are applied to the respective word lines and a precharge voltage is applied to the common source line. At the step S207 of performing the program loop, a program voltage is applied to the selected word line, and pass voltages are applied to unselected word lines.

Figure 8:
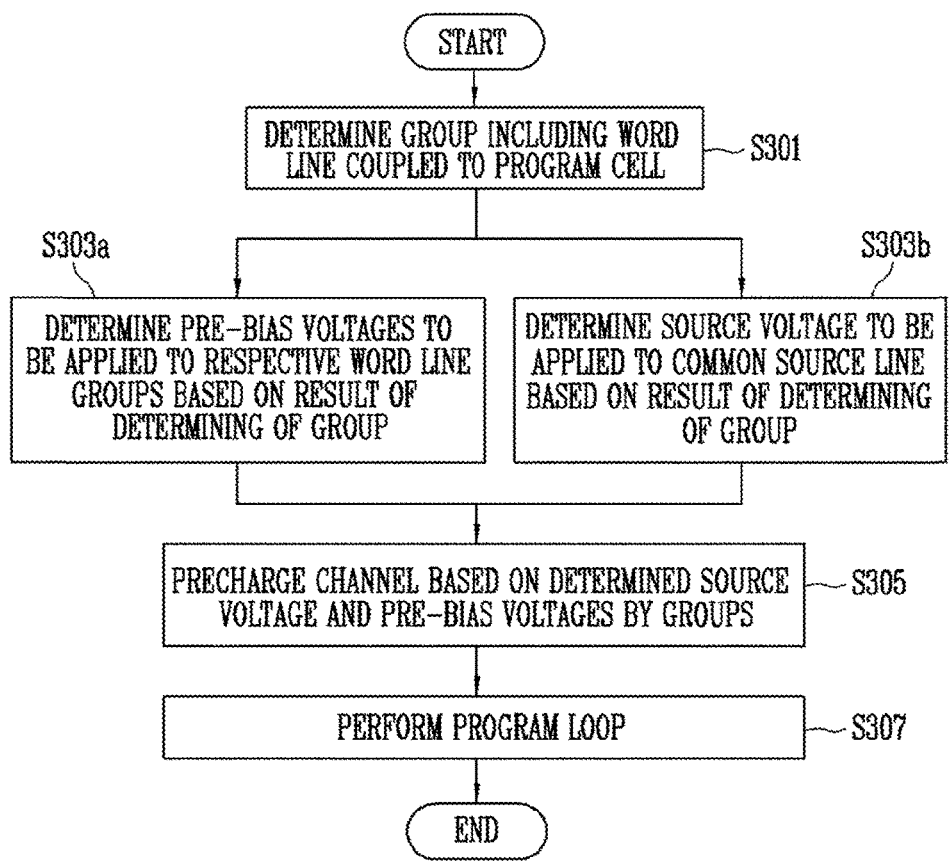
FIG. 8 is a flowchart illustrating the step of performing the program operation, based on the result of grouping the word lines of FIG. 6.

FIG. 8 is a flowchart showing another embodiment illustrating in detail the step of performing the program operation, based on the result of grouping the word lines of FIG. 6.

Referring to FIG. 8, the step of performing the program operation based on the result of the grouping of the word lines includes a step S301 of determining a word line group that includes a word line coupled to a program cell, a step S303a of determining pre-bias voltages to be applied to the respective word line groups based on a result of the determining of the word line group, a step S303b of determining a source voltage to be applied to the common source line based on the result of the determining of the word line group, a step S305 of precharging channel regions of memory cells based on the determined source voltage and pre-bias voltages, and a step S307 of performing a program loop. The embodiment of FIG. 8, unlike the embodiment of FIG. 7, further includes the step S303b of determining the source voltage to be applied to the common source line, based on the result of the determining of the word line group that is performed at the step S301.

At the step S303b, the closer a word line coupled to the selected memory cell for the program operation is to the first-programmed memory cell, the greater the source voltage to be applied to the common source line may be. For example, referring to FIG. 8 together with FIG. 4B, a source voltage to be applied to the common source line CSL, in the case where a selected word line that is targeted for the program operation is included in the second group Group2, is higher than a source voltage to be applied to the common source line CSL, in the case where the selected word line that is targeted for the program operation is included in the first group Group1. In another example, a source voltage to be applied to the common source line CSL, in the case where the selected word line that is targeted for the program operation is included in the third group Group3, is higher than a source voltage to be applied to the common source line CSL, in the case where the selected word line that is targeted for the program operation is included in the second group Group2. In another example, a source voltage to be applied to the common source line CSL, in the case where the selected word line that is targeted for the program operation is included in the fourth group Group4, is higher than a source voltage to be applied to the common source line CSL, in the case where the selected word line that is targeted for the program operation is included in the third group Group3.

In another embodiment, at the step S303b, the closer a word line coupled to the selected memory cell for the program operation is to the first-programmed memory cell, the lower the source voltage to be applied to the common source line may be. For example, referring to FIG. 8 together with FIG. 4B, a source voltage to be applied to the common source line CSL, in the case where a selected word line that is targeted for the program operation is included in the first group Group1, is higher than a source voltage to be applied to the common source line CSL, in the case where the selected word line that is targeted for the program operation is included in the second group Group2. In another example, a source voltage to be applied to the common source line CSL, in the case where the selected word line that is targeted for the program operation is included in the second group Group2, is higher than a source voltage to be applied to the common source line CSL, in the case where the selected word line that is targeted for the program operation is included in the third group Group3. In another example, a source voltage to be applied to the common source line CSL, in the case where the selected word line that is targeted for the program operation is included in the third group Group3, is higher than a source voltage to be applied to the common source line CSL, in the case where the selected word line that is targeted for the program operation is included in the fourth group Group4.

At the step S305, a channel precharge operation may be performed based on the pre-bias voltages determined at the step S303a and the source voltage determined at the step S303b.

Figure 9:
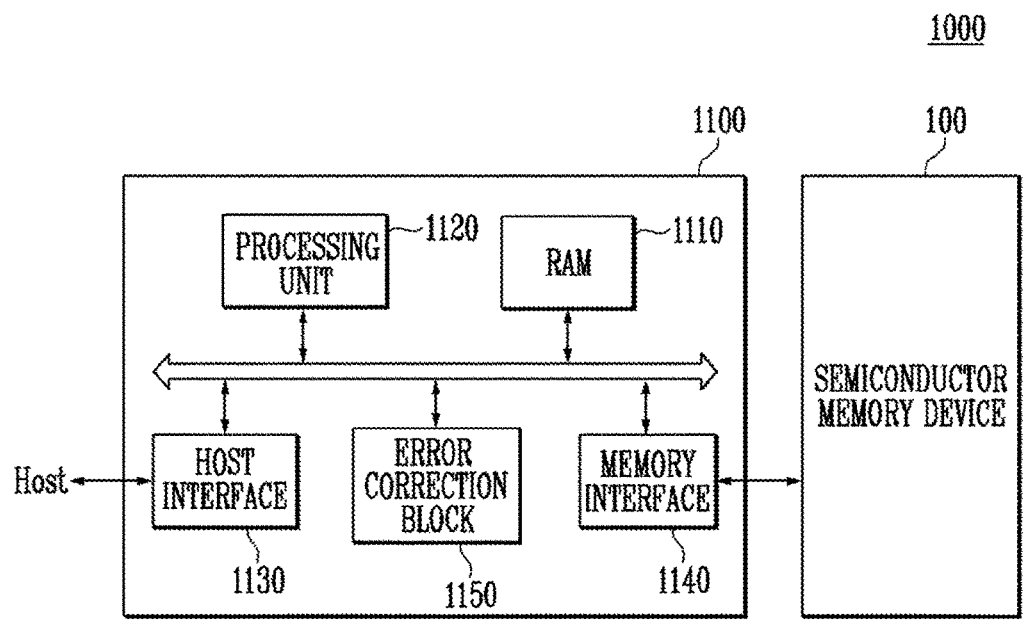
FIG. 9 is a block diagram for describing an embodiment of a memory system including the semiconductor memory device of FIG. 1.

FIG. 9 is a block diagram of a memory system including the semiconductor memory device of FIG. 1.

Referring to FIG. 9, the memory system 1000 includes the semiconductor memory device 100 and a controller 1100.

The semiconductor memory device 100 may have the same configuration and operation as those of the semiconductor memory device described with reference to FIG. 1. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an embodiment, the error correction block may be provided as an element of the controller 1100.

The controller 1100 and the semiconductor memory device 100 may be integrated into a single semiconductor device. The controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be enhanced.

In another embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 10:
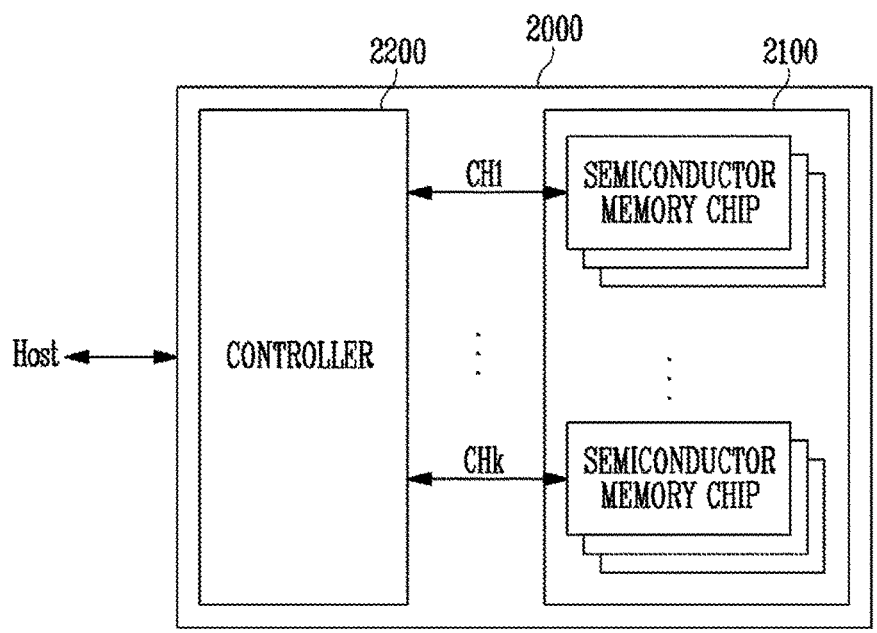
FIG. 10 is a block diagram for describing another embodiment of a memory system including the semiconductor memory device of FIG. 1.

FIG. 10 is a block diagram of another embodiment of a memory system including the semiconductor memory device of FIG. 1.

Referring FIG. 10, the memory system 2000 includes a semiconductor memory device 2100 and a controller 2200. The semiconductor memory device 2100 includes a plurality of memory chips. The semiconductor memory chips are divided into a plurality of groups.

In FIG. 10, it is illustrated that each of the plurality of groups communicates with the controller 2200 through first to $k_{th}$ channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 9 and is configured to control a plurality of memory chips of the semiconductor memory device 2100 through the plurality of channels CH1 to CHk.

Figure 11:
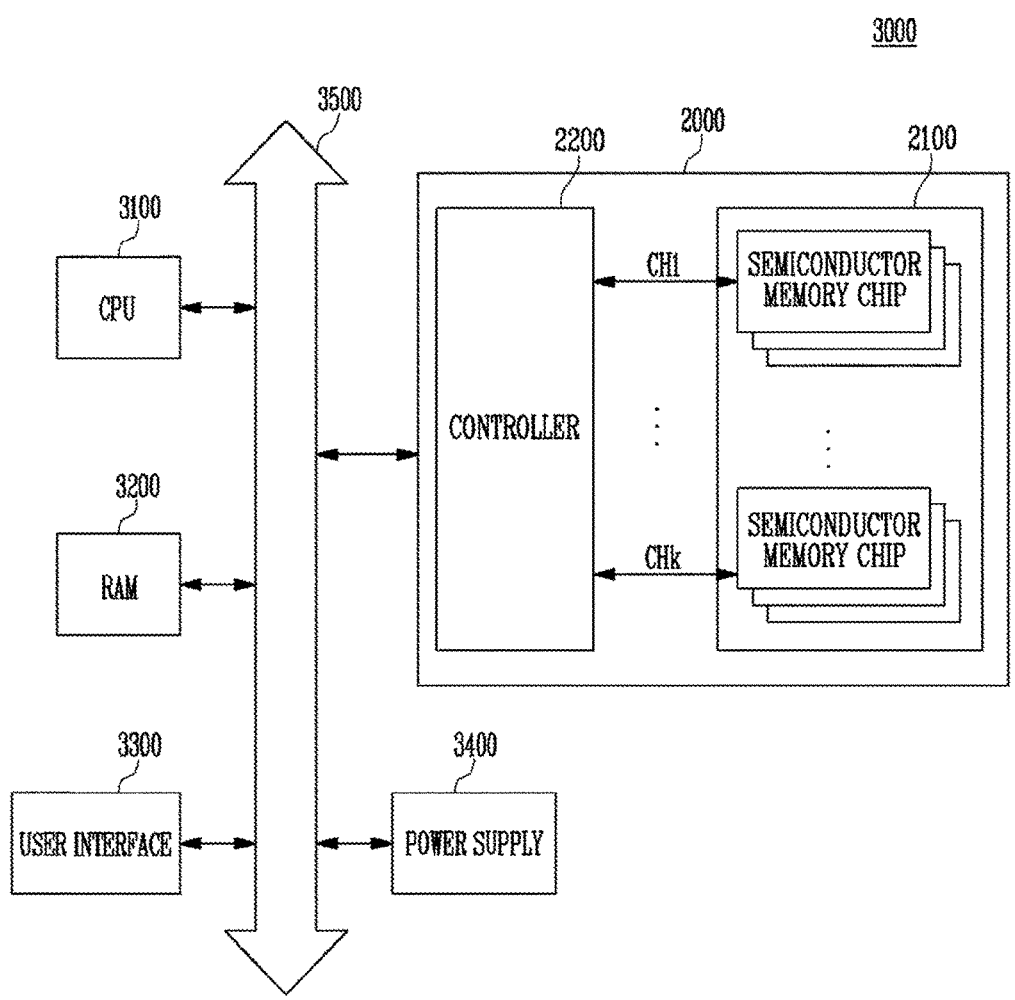
FIG. 11 is a block diagram illustrating a computing system including the memory system of FIG. 10.

FIG. 11 is a block diagram illustrating a computing system including the memory system of FIG. 10.

Referring to FIG. 11, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 11, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 11, the memory system 2000 described with reference to FIG. 10 is illustrated as being used. However, the memory system 2000 may be replaced with the memory system 1000 described with reference to FIG. 9. In an embodiment, the computing system 3000 may include all of the memory systems 1000 and 2000 described with reference to FIGS. 9 and 10.

For a semiconductor memory device in an embodiment in accordance with the present invention, a program disturb phenomenon of the adjacent memory cell is mitigated during a program operation.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and detail may be made without departing from the spirit and scope of the present invention as set forth in the following claims.

What is claimed is:

1. A semiconductor memory device comprising:
a memory cell array including a plurality of memory cells connected to a plurality of word lines, respectively;
a peripheral circuit configured to apply a program voltage to a selected word line among the plurality of word lines; and
a control logic configured to control the peripheral circuit to apply pre-bias voltages to the plurality of word lines respectively before the program voltage is applied to the selected word line,
wherein the pre-bias voltages are determined based on a program sequence of the plurality of word lines, and
wherein the pre-bias voltages are applied for a precharge operation in which a precharge voltage is applied to a common source line of the plurality of memory cells.

2. The semiconductor memory device according to claim 1,
wherein the plurality of word lines are grouped into a plurality of word line groups,
wherein the plurality of word lines are programmed in a direction away from a first programmed word line, and
wherein the earlier a word line group among the plurality of word line groups is programmed, the lower a pre-bias voltage to be applied to word lines included in the word line group is.

3. The semiconductor memory device according to claim 1,
wherein the plurality of word lines are grouped into a plurality of word line groups,
wherein the plurality of word lines are programmed in a sequence from a word line adjacent to a source select transistor to a word line adjacent to a drain select transistor, and
wherein the later a word line group among the plurality of the word line groups is programmed, the greater a pre-bias voltage to be applied to word lines included in the word line group is.

4. The semiconductor memory device according to claim 3, wherein each of the plurality of word line groups includes the same number of word lines.

5. The semiconductor memory device according to claim 3, wherein the earlier a word line group among the plurality of the word line groups is programmed, the greater the number of word lines included in the word line group is.

6. The semiconductor memory device according to claim 3, wherein a pre-bias voltage that is applied to word lines included in a word line group to which the selected word line belongs has a default value, and the pre-bias voltage that is applied to the plurality of word lines disposed between the word line group to which the selected word line belongs and the source select transistor also has the default value.

7. The semiconductor memory device according to claim 3, wherein the control logic determines the precharge voltage to be applied to the common source line based on a program sequence of the selected word line.

8. The semiconductor memory device according to claim 7, wherein the control logic controls the peripheral circuit such that the closer the selected word line is to the source select transistor, the greater the precharge voltage to be applied to the common source line is.

9. The semiconductor memory device according to claim 1,
wherein the plurality of word lines are grouped into a plurality of word line groups,
wherein the plurality of word lines are programmed in a sequence from a word line adjacent to a drain select transistor to a word line adjacent to a source select transistor, and
wherein the later a word line group among the plurality of the word line groups is programmed, the greater a pre-bias voltage to be applied to word lines included in the word line group is.

10. The semiconductor memory device according to claim 9, wherein a pre-bias voltage that is applied to word lines included in a word line group to which the selected word line belongs has a default value, and the pre-bias voltage that is applied to the plurality of word lines disposed between the word line group to which the selected word line belongs and the drain select transistor also has a default value.

11. The semiconductor memory device according to claim 9,
wherein the control logic determines the precharge voltage to be applied to the common source line based on a program sequence of the selected word line, and
wherein the control logic controls the peripheral circuit such that the later the selected word line is programmed, the greater the precharge voltage to be applied to the common source line is.

12. An operating method of a semiconductor memory device, comprising:
applying pre-bias voltages to a plurality of word lines respectively; and
applying a program voltage to a selected word line among the plurality of word lines after the pre-bias voltages are applied to the plurality of word lines,
wherein the pre-bias voltages are determined according to a program sequence of the plurality of word lines,
wherein the pre-bias voltages are applied for a precharge operation in which a precharge voltage is applied to a common source line of the plurality of memory cells, and
wherein the pre-bias voltages are applied for a precharge operation in which a precharge voltage is applied to a common source line of the plurality of memory cells.

13. The operating method according to claim 12,
wherein the plurality of word lines are grouped into a plurality of word line groups based on positions of the plurality of word lines,
wherein the plurality of word lines are programmed in a direction away from a first programmed word line, and wherein the earlier a word line group among the plurality of the word line groups is programmed, the lower a pre-bias voltage to be applied to word lines included in the word line group is.

14. The operating method according to claim 12,
wherein the plurality of word lines are grouped into a plurality of word line groups based on positions of the plurality of word lines,
wherein the plurality of word lines are programmed in a sequence from a word line adjacent to a source select transistor to a word line adjacent to a drain select transistor, and
wherein the later a word line group among the plurality of word line groups is programmed, the greater a pre-bias voltage to be applied to word lines included in the word line group is.

15. The operating method according to claim 14,
wherein each of the plurality of word line groups includes the same number of word lines.

16. The operating method according to claim 14,
wherein the earlier a word line group among the plurality of word line groups is programmed, the greater the number of word lines included in the word line group is.

17. The operating method according to claim 12,
applying the precharge voltage to be applied to the common source line such that the earlier the selected word line is programmed, the greater the precharge voltage to be applied to the common source line is.

18. The operating method according to claim 12,
wherein the plurality of word lines are grouped into a plurality of word line groups based on positions of the plurality of word lines,
wherein the plurality of word lines are programmed in a sequence from a word line adjacent to a drain select transistor to a word line adjacent to a source select transistor, and
wherein the later a word line group among the plurality of word line groups is programmed, the greater a pre-bias voltage to be applied to word lines included in the word line group is.

19. The operating method according to claim 18,
applying the precharge voltage to be applied to the common source line such that the earlier the selected word line is programmed, the greater the precharge voltage to be applied to the common source line is.

20. The operating method according to claim 18,
wherein a pre-bias voltage that is applied to word lines included in a word line group to which the selected word line belongs has a default value, and the pre-bias voltage that is applied to the plurality of word lines disposed between the word line group to which the selected word line belongs and the drain select transistor also has a default value.

21. The semiconductor memory device according to claim 7, wherein the control logic controls the peripheral circuit such that the further the selected word line is from the source select transistor, the greater the precharge voltage to be applied to the common source line is.

22. The semiconductor memory device according to claim 9,
wherein the control logic determines the precharge voltage to be applied to the common source line based on a program sequence of the selected word line, and
wherein the control logic controls the peripheral circuit such that the earlier the selected word line is programmed, the greater the precharge voltage to be applied to the common source line is.

23. The operating method according to claim 12,
applying the precharge voltage to be applied to the common source line such that the later the selected word line is programmed, the greater the precharge voltage to be applied to the common source line is.

24. The operating method according to claim 18,
applying the precharge voltage to be applied to the common source line such that the later the selected word line is programmed, the greater the precharge voltage to be applied to the common source line is.

* * * * *